(12) United States Patent
Toyama et al.

(10) Patent No.: US 12,213,294 B2
(45) Date of Patent: Jan. 28, 2025

(54) ELECTRONIC CONTROL DEVICE

(71) Applicant: HITACHI ASTEMO, LTD., Hitachinaka (JP)

(72) Inventors: Masahiro Toyama, Tokyo (JP); Yuki Nakamura, Tokyo (JP); Yutaka Uematsu, Tokyo (JP); Hideyuki Sakamoto, Hitachinaka (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 389 days.

(21) Appl. No.: 17/605,650

(22) PCT Filed: Mar. 31, 2020

(86) PCT No.: PCT/JP2020/014963
§ 371 (c)(1),
(2) Date: Oct. 22, 2021

(87) PCT Pub. No.: WO2020/217891
PCT Pub. Date: Oct. 29, 2020

(65) Prior Publication Data
US 2022/0248575 A1    Aug. 4, 2022

(30) Foreign Application Priority Data

Apr. 23, 2019    (JP) .................................. 2019-082014

(51) Int. Cl.
*H05K 9/00*    (2006.01)
*H05K 1/02*    (2006.01)
*H05K 1/11*    (2006.01)

(52) U.S. Cl.
CPC ......... *H05K 9/0039* (2013.01); *H05K 1/0234* (2013.01); *H05K 1/115* (2013.01);
(Continued)

(58) Field of Classification Search
CPC ... H05K 9/0039; H05K 9/0033; H05K 9/0049
(Continued)

(56) References Cited

U.S. PATENT DOCUMENTS 4,837,664 A * 6/1989 Rodriguez, II .... H05K 7/20545
165/185
5,672,844 A * 9/1997 Persson ................ H05K 9/0039
361/753

(Continued)

FOREIGN PATENT DOCUMENTS

JP    H02-156597 A    6/1990
JP    H05-129790 A    5/1993
(Continued)

OTHER PUBLICATIONS

International Search Report with English translation and Written Opinion issued in corresponding application No. PCT/JP2020/014963 dated Jul. 21, 2020.

*Primary Examiner* — Hung S. Bui
(74) *Attorney, Agent, or Firm* — Foley & Lardner LLP

(57) ABSTRACT

An electronic control device includes a conductive casing; a circuit board which is provided in the casing, and on which an electronic component including an integrated circuit is mounted; and a conductive conductor component that is provided on the circuit board, is disposed at a position higher than the electronic component, and has an elongated shape, in which a distance between the conductor component and the casing is shorter than a distance between the conductor component and the circuit board.

17 Claims, 16 Drawing Sheets

(52) U.S. Cl.
CPC ......... *H05K 9/0033* (2013.01); *H05K 9/0049*
(2013.01); *H05K 2201/09381* (2013.01)

(58) Field of Classification Search
USPC ............... 361/816, 728, 760, 752, 799, 818
See application file for complete search history.

(56) References Cited

U.S. PATENT DOCUMENTS

| | | | | |
|---|---|---|---|---|
| 6,016,084 | A * | 1/2000 | Sugimoto | H03H 7/1758 |
| | | | | 361/818 |
| 6,542,380 | B1 * | 4/2003 | Hailey | H05K 9/0039 |
| | | | | 361/802 |
| 7,626,832 | B2 * | 12/2009 | Muramatsu | H05K 9/0069 |
| | | | | 361/818 |
| 2003/0193794 | A1 * | 10/2003 | Reis | H05K 7/20445 |
| | | | | 257/E23.114 |
| 2006/0171127 | A1 | 8/2006 | Kadoya et al. | |
| 2017/0118841 | A1 * | 4/2017 | Ino | H05K 1/0224 |
| 2019/0393166 | A1 * | 12/2019 | Otsubo | H01L 23/552 |
| 2020/0022281 | A1 * | 1/2020 | Diep | H05K 7/20445 |
| 2022/0173085 | A1 * | 6/2022 | Otsubo | H01L 24/48 |

FOREIGN PATENT DOCUMENTS

| | | | |
|---|---|---|---|
| JP | 2001-223489 A | 8/2001 | |
| JP | 2005-223267 A | 8/2005 | |
| JP | 2006-190726 A | 7/2006 | |
| JP | 2010-103371 A | 5/2010 | |
| JP | 2019-029476 A | 2/2019 | |
| WO | WO-2018164158 A1 * | 9/2018 | ......... H01L 23/3121 |

* cited by examiner

ELECTRONIC CONTROL DEVICE

CROSS-REFERENCE OF RELATED APPLICATIONS

This application is a continuation of International Patent Application No. PCT/JP2020/014963, filed on Mar. 31, 2020, which claims the priority of a Japanese patent application submitted on Apr. 23, 2019, with application No. JAPAN 2019-082014 and entitled "ELECTRONIC CONTROL DEVICE", both of which are incorporated in the present application by reference.

TECHNICAL FIELD

The present invention relates to an electronic control device.

BACKGROUND ART

In order to realize a driving support system such as a collision damage reducing brake, automatic driving, and the like, calculation performance required for an electronic control device of an automobile is high. Therefore, an integrated circuit having a high operation frequency is mounted on the electronic control device.

Accordingly, the electronic control device tends to easily cause a failure in a case where electrical and electromagnetic noise is coupled to the circuit. In the electronic control device of the automobile, in order to ensure safety of the automobile, a method of evaluating resistance to external electromagnetic noise is defined as an international standard. In addition, a test method is also defined as an international standard for static electricity that can also cause a problem as a source of electromagnetic noise.

PTL 1 discloses a radio-frequency shield circuit that covers an entire electronic component on a substrate with a metal cover.

CITATION LIST

Patent Literature

PTL 1: JP 2005-223267 A

SUMMARY OF INVENTION

Technical Problem

The technique of PTL 1 has a problem that heat dissipation of an electronic component covered with a metal cover and installation of the metal cover are costly.

Solution to Problem

It is preferable that an electronic control device according to a first aspect of the present invention includes: a conductive casing; a circuit board which is provided in the casing, and on which an electronic component including an integrated circuit is mounted; and a conductive conductor component that is provided on the circuit board, is disposed at a position higher than the electronic component, and has an elongated shape, in which a distance between the conductor component and the casing is shorter than a distance between the conductor component and the circuit board.

It is preferable that an electronic control device according to a second aspect of the present invention includes: a conductive casing; a circuit board which is provided in the casing, and on which an electronic component including an integrated circuit is mounted; a conductive conductor component that is provided on the circuit board, is disposed at a position higher than the electronic component, and has an elongated shape; and a dielectric that is inserted between the conductor component and the casing, in which a distance from the conductor component to the casing is shorter than a multiplication value of a distance from the conductor component to the circuit board and a relative permittivity of the dielectric.

Advantageous Effects of Invention

According to the present invention, heat dissipation of an electronic component is excellent, and an influence on a circuit board due to noise entering and exiting from a gap of a casing and unnecessary electromagnetic wave radiation can be suppressed at low cost.

DESCRIPTION OF EMBODIMENTS

Figure 1:
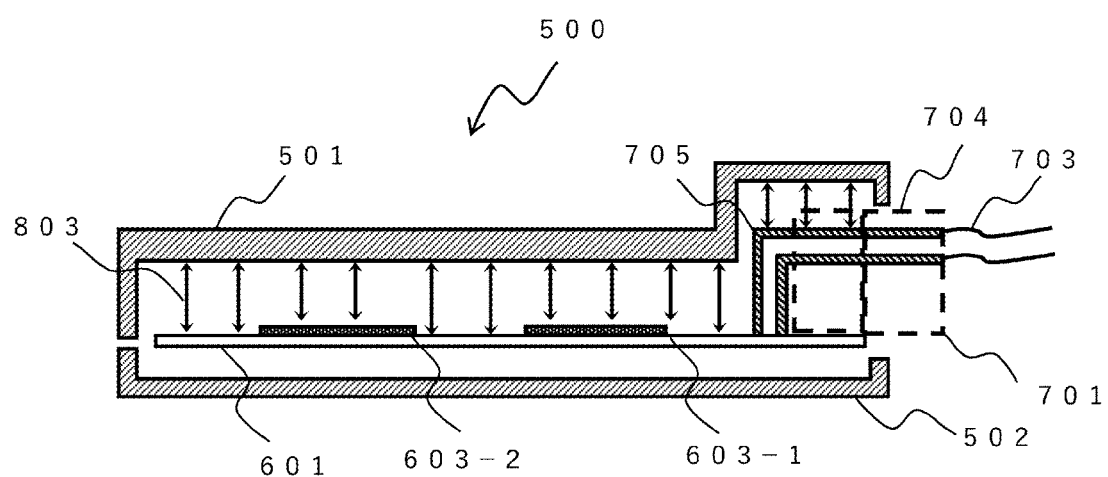
FIG. 1 is a sectional view of an electronic control device according to a comparative example.

Hereinafter, embodiments of the present invention will be described with reference to the drawings. The following description and drawings are examples for describing the present invention, and are omitted and simplified as appropriate for the sake of clarity of description. The present invention can be carried out in various other forms. Unless otherwise specified, each component may be singular or plural.

Positions, sizes, shapes, ranges, and the like of the components illustrated in the drawings may not represent actual positions, sizes, shapes, ranges, and the like in order to facilitate understanding of the invention. Therefore, the present invention is not necessarily limited to the positions, sizes, shapes, ranges, and the like disclosed in the drawings.

Comparative Example

An in-vehicle electronic control device 500 as a comparative example with the present embodiment will be described with reference to FIG. 1.

FIG. 1 is a sectional view of the electronic control device 500 according to the comparative example. The electronic control device 500 includes a casing upper portion 501 and a casing lower portion 502 that are made of metal, and a circuit board 601 is stored inside to be sandwiched between the casing upper portion 501 and the casing lower portion 502 from above and below. Integrated circuits 603-1 and 603-2 are mounted on the circuit board 601. On the circuit board 601, a connector 701 is mounted at an end portion of the circuit board 601. The connector 701 includes a connector pin 705 connected to a circuit on the circuit board 601, and a housing 704 covering the connector pin 705. The connector 701 indicates a state in which female and male connectors are connected. The connector pin 705 in the connector 701 is connected to a wire harness 703, and is led out to the outside of the electronic control device 500.

A gap around the connector 701, a resin portion of the housing 704 of the connector 701, and the like become an opening portion of a shield configured by the casing upper portion 501 and the casing lower portion 502 that are made of metal, and electromagnetic noise intrudes from the outside. In addition, a gap between the casing upper portion 501 and the casing lower portion 502 other than the periphery of the connector 701 also serves as an entrance of the electromagnetic noise.

As illustrated in FIG. 1, an electric field 803 due to the intruded electromagnetic noise is generated in the casing of the electronic control device 500. The electric field 803 propagates in a space between the circuit board 601 and the casing upper portion 501, and the integrated circuits 603-1 and 603-2 on the circuit board 601 and the circuits on the circuit board 601 around them are exposed to the electric field of the electromagnetic noise, which leads to an operation failure. In particular, in a frequency band where the size of the casing and the wavelength are close to each other, resonance is caused in a space in the casing, and a problem is caused by strong coupling with the circuit board. Here, in order to prioritize clarity, the electric field 803 of the electromagnetic noise is described only between the casing upper portion 501 and the circuit board 601 where the opening portion is large and the electromagnetic noise easily intrudes, but the electromagnetic noise also intrudes between the casing lower portion 502 and the circuit board 601.

In order to solve such a problem, it is conceivable to completely cover the integrated circuits 603-1 and 603-2 on the circuit board 601 with a metal cover, but heat dissipation of the integrated circuits 603-1 and 603-2 becomes difficult, and there is a possibility that a space and cost are increased due to the installation of the metal cover on the circuit board 601.

In the present embodiment described below, the heat dissipation of the electronic component is excellent, and noise entering and exiting from the gap of the casing and unnecessary electromagnetic wave radiation can be suppressed at low cost.

First Embodiment

Figure 2:
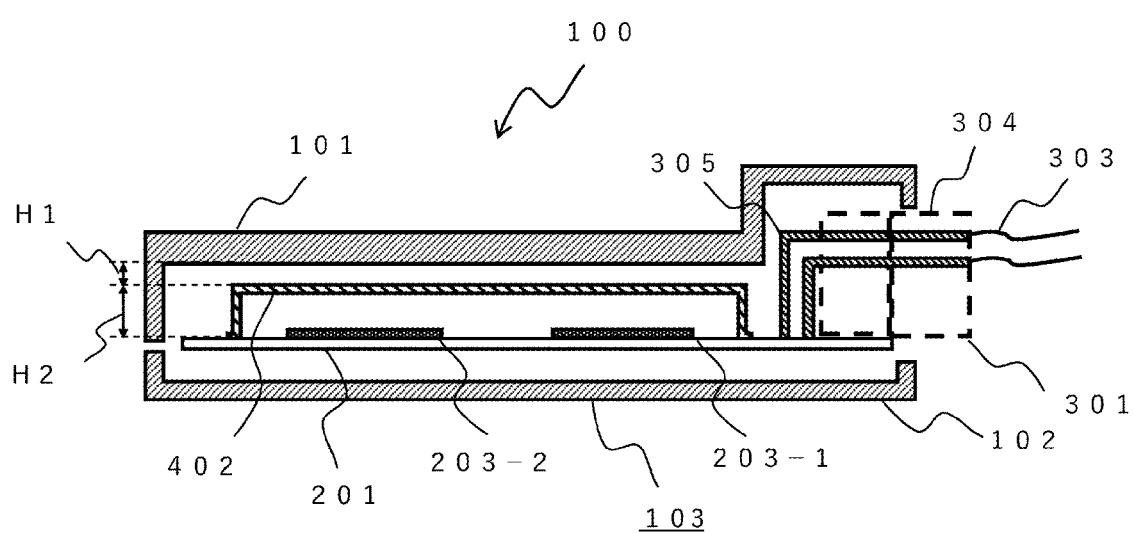
FIG. 2 is a sectional view of an electronic control device according to a first embodiment.
Figure 3:
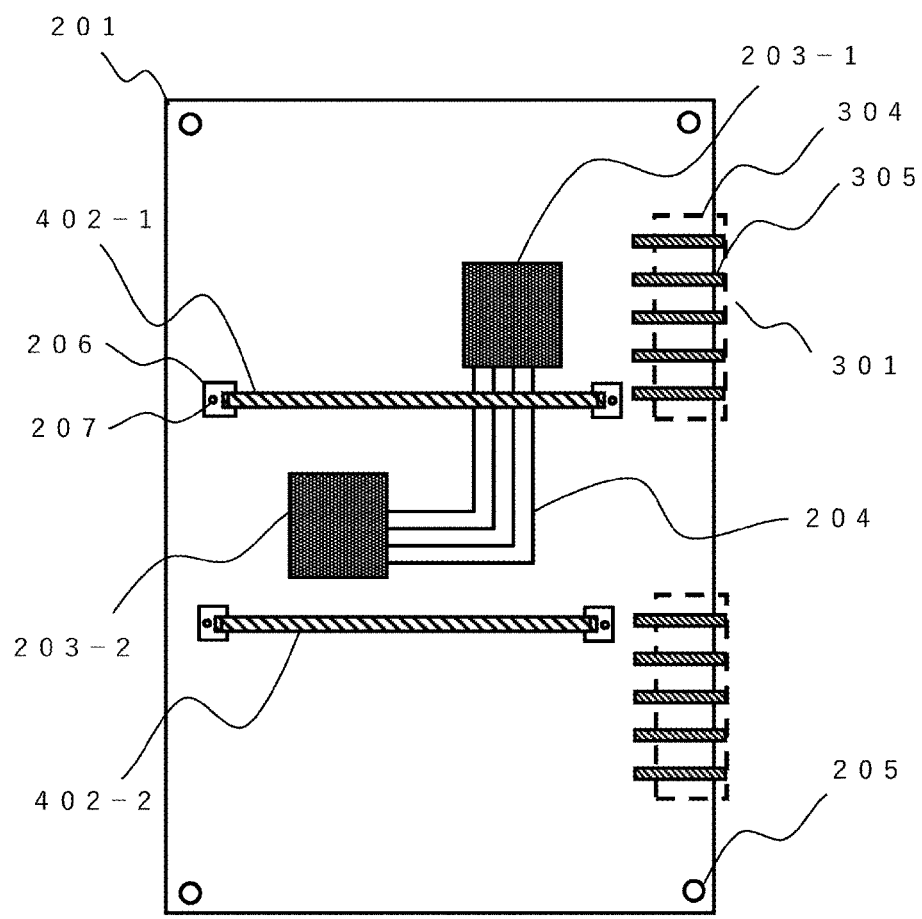
FIG. 3 is a top view of a circuit board of the electronic control device according to the first embodiment.
Figure 4:
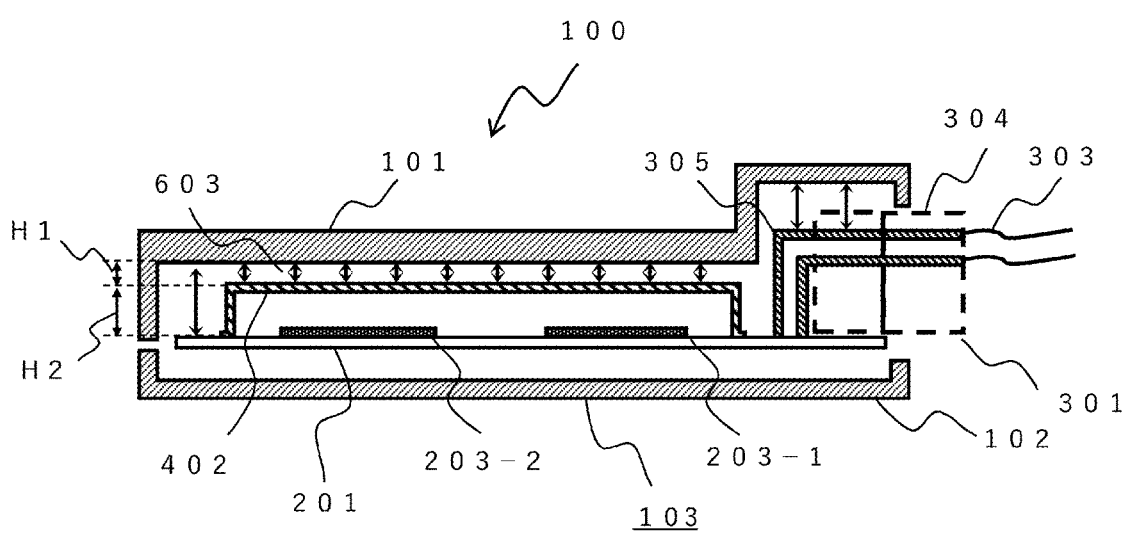
FIG. 4 is a diagram illustrating a distribution of an electric field due to electromagnetic noise in a sectional view of the electronic control device according to the first embodiment.

A first embodiment of the present invention will be described with reference to FIGS. 2 to 4. FIG. 2 is a sectional view of an electronic control device 100. FIG. 3 is a top view of a circuit board 201 in the electronic control device 100. FIG. 4 is a diagram illustrating a distribution of an electric field due to electromagnetic noise in a sectional view of the electronic control device 100.

As illustrated in FIG. 2, the electronic control device 100 includes a casing upper portion 101 and a casing lower portion 102 that are made of metal, and the circuit board 201 is stored inside to be sandwiched between the casing upper portion 101 and the casing lower portion 102 from above and below. In the following description, the casing upper portion 101 and the casing lower portion 102 may be collectively referred to as a casing 103. Integrated circuits 203-1 and 203-2 are mounted on the circuit board 201. On the circuit board 201, a connector 301, which is an external connection terminal, is mounted at an end portion of the circuit board 201. The connector 301 includes a connector pin 305 connected to a circuit on the circuit board 201, and a connector housing 304 covering the connector pin 305. The connector 301 indicates a state in which female and male connectors are connected. The connector pin 305 in the connector 301 is connected to a wire harness 303, and is led out to the outside of the electronic control device 100.

As illustrated in FIG. 2, a conductor component 402 is mounted such that both ends thereof are connected to the circuit board 201. A distance H1 between the upper surface of the conductor component 402 and the casing upper portion 101 is arranged to be shorter than a distance H2 between the upper surface of the conductor component 402 and the upper surface of the circuit board 201.

As illustrated in FIG. 3, screw fixing holes 205 are provided at four corners of the circuit board 201, and the circuit board 201 is fixed to the casing lower portion 102 using screws via the screw fixing holes 205. A signal wiring 204 is arranged in a region around the integrated circuit 203-1 and the integrated circuit 203-2. Conductor components 402-1 and 402-2 are disposed so as to straddle the region or pass over the periphery. Further, the conductor components 402-1 and 402-2 are disposed so as to connect one side of the circuit board 201 where the connector 301 is arranged and the other side of the circuit board 201 where the connector 301 is not arranged. The conductor components 402-1 and 402-2 are arranged in parallel on the circuit board 201, and the interval is an interval that divides the circuit board 201 into substantially equal parts. The conductor components 402-1 and 402-2 are disposed to be positioned near the connector 301. In the example illustrated in FIG. 3, two conductor components 402-1 and 402-2 are arranged, but a plurality of conductor components may be arranged. Also in this case, the conductor components are arranged at substantially equal intervals. In the following description, a plurality of conductor components may be referred to as the conductor component 402.

Both ends of the conductor components 402-1 and 402-2 are soldered to lands 206 on the circuit board 201. The lands 206 on the circuit board 201 are connected to a ground layer of the inner layer of the circuit board 201 by via holes 207. Here, the connection by the via hole has been described as an example, but the connection may be made to the around by wiring on the surface layer of the circuit board 201. In addition, instead of the direct connection to the ground in the circuit board 201, the connection to the ground may be made in an AC manner via a capacitor or the like. Both the ends of the conductor components 402-1 and 402-2 may be electrically connected directly to the casing upper portion 101 or the casing lower portion 102, or may be connected to a pattern electrically connected to the casing upper portion 101 or the casing lower portion 102.

The conductor component 402 is formed of a conductive material such as copper. In addition, the conductor component 402 may have an elongated shape, and for example, a plate shape, a linear shape, a rod shape, a tubular shape, and the like are included. In the present embodiment and the embodiments described below, a plate shape will be described as an example. Furthermore, the conductor component 402 having an elongated shape does not need to be straight, and may be distorted according to the arrangement of components, the shape of the casing, and the like.

As illustrated in FIG. 4, an electric field 603 due to the intruded electromagnetic noise is generated in the casing of the electronic control device 100. Here, since the upper surface of the conductor component 402 disposed on the circuit board 201 is disposed closer to the casing upper portion 101 than the circuit board 201, the electric field 603 due to the intruded electromagnetic noise is concentrated between the conductor component 402 and the casing upper portion 101. As a result, the integrated circuits 203-1 and 203-2 on the circuit board 201, the signal wiring 204 on the circuit board 201 around them, and the like are less likely to be affected by the electric field of the electromagnetic noise.

The arrangement example of the conductor component 402 in the present embodiment is effective for a case where noise intruding from the connector 301 side resonates with a casing size connecting one side of the circuit board 201 where the connector 301 is arranged and the other side of the circuit board 201 where the connector 301 is not arranged to form a standing wave.

As described above, the electromagnetic noise having intruded the metal casing 103 is intensively propagated to a portion where the circuit board 201 and the casing 103 are close to each other and the impedance seems to be low with respect to the electromagnetic noise. Since the conductor component 402 mounted on the circuit board 201 is arranged at a position closer to the casing 103 than the circuit board 201, electromagnetic noise is concentrated between the conductor component 402 and the casing 103, and the integrated circuit 203 and the like on the circuit board 201 are protected from the electromagnetic noise. From the characteristic of controlling and concentrating the path of the electromagnetic noise, unlike the shield structure in the related art, an effect of protecting the integrated circuit 203 and the like to be protected from the electromagnetic noise can be obtained without covering the entire integrated circuit 203 and the like, so that compatibility with a heat dissipation structure and the like is facilitated. In addition, an area on the circuit board 201 necessary for the installation of the conductor component 402 can also be reduced, the structure is simple, and cost can be reduced.

Furthermore, since the noise propagation generated by the integrated circuit 203 and the like is also suppressed by the reciprocal theorem in electromagnetism, a suppression effect can also be obtained for unnecessary electromagnetic waves radiated from the circuit board 201 to the outside.

Second Embodiment

Figure 5:
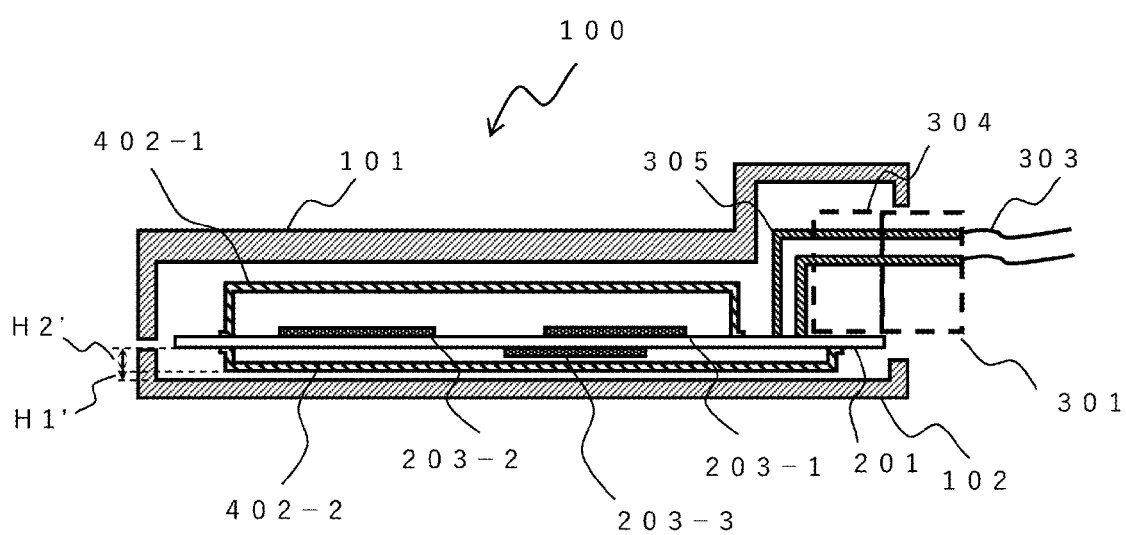
FIG. 5 is a sectional view of an electronic control device according to a second embodiment.

A second embodiment of the present invention will be described with reference to FIG. 5. FIG. 5 is a sectional view of the electronic control device 100. In the present embodiment, in addition to the configuration of the first embodiment, a conductor component 402-2 is also disposed between the circuit board 201 and the casing lower portion 102. The same portions as those of the first embodiment are denoted by the same reference numerals, and the description thereof will be omitted.

An integrated circuit 203-3 is disposed on the back surface of the circuit board 201. A plurality of conductor components 402 are disposed on the back surface of the circuit board 201 so as to straddle the upper portion of the integrated circuit 203-3. Specifically, a distance H1' between the lower surface of the conductor component 402-2 and the casing lower portion 102 is arranged to be shorter than a distance H2' between the lower surface of the conductor component 402 and the back surface of the circuit board 201.

The material, shape, and the like of the conductor component 402-2 are similar to those described in the first embodiment. In addition, the connection between the conductor component 402-2 and the circuit board 201 and the like is also similar to that described in the first embodiment.

According to the present embodiment, the integrated circuit 203-3 and the like can also be protected from electromagnetic noise intruding between the circuit board 201 and the casing lower portion 102. Other effects are the same as those described in the first embodiment.

Third Embodiment

Figure 6:
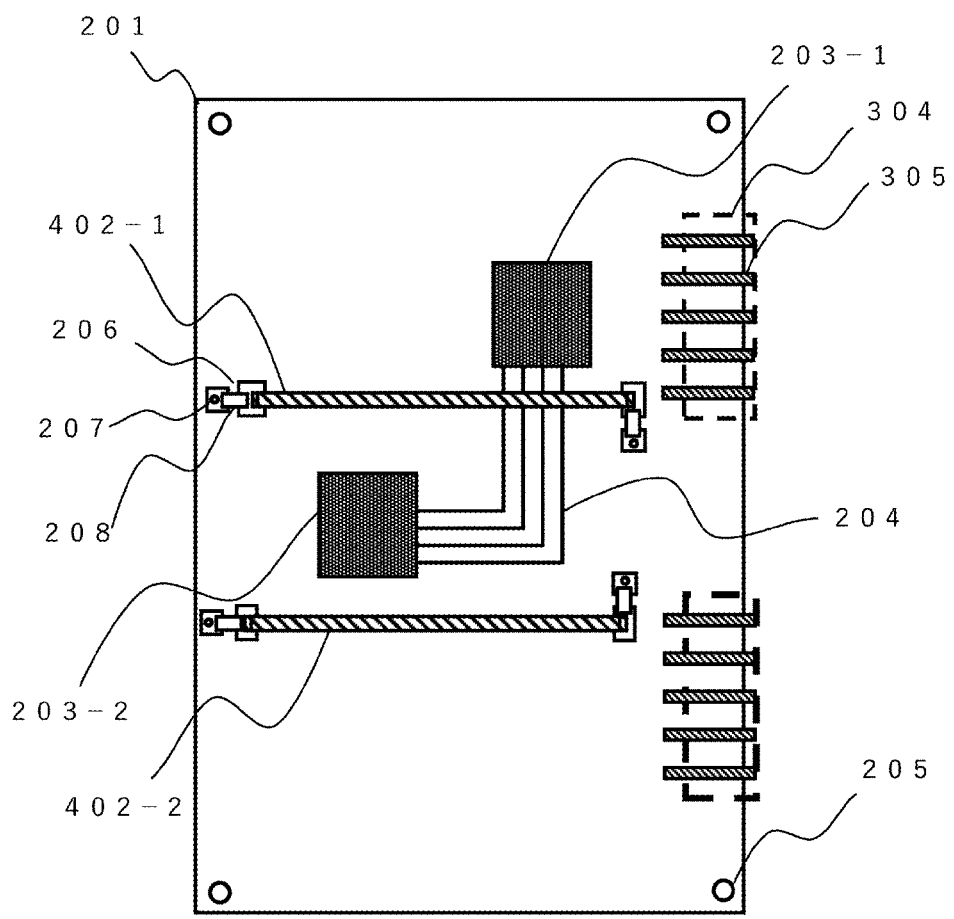
FIG. 6 is a top view of a circuit board of an electronic control device according to a third embodiment.

A third embodiment of the present invention will be described with reference to FIG. 6. FIG. 6 is a top view of the circuit board 201 in the electronic control device 100. The same portions as those of the first embodiment illustrated in FIG. 3 and the like are denoted by the same reference numerals, and the description thereof will be omitted.

In the present embodiment, a resistor 208 is inserted between the land 206 for mounting the conductor component 402, the ground in the circuit board 201, and the via hole 207. At a frequency at which electrical resonance occurs on the conductor component 402 and noise is accumulated, the effect described in the first embodiment may be reduced. As in the present embodiment, by connecting the conductor component 402 via the resistor 208, the resonance energy is converted into the thermal energy, so that the reduction of the effect can be avoided.

A resistance value of the resistor 208 is set to a value close to the characteristic impedance when the casing upper portion 101 and the conductor component 402 are regarded as the transmission line, so that a situation close to the matching termination is obtained. In other words, the resistor 208 has a resistance value corresponding to the characteristic impedance determined from the sectional structures of the conductor component 402 and the casing 103. As a result, reflection at the resistor 208 can be suppressed, and conversion into thermal energy can be most effectively performed. For example, in a case where the distance between the casing upper portion 101 and the conductor component 402 is several millimeters and the conductor component has a width of about 3 mm and a thickness of about 0.5 mm, a resistance of about 1Ω to 10Ω may be used.

The material, shape, and the like of the conductor component 402 are similar to those described in the first embodiment. Other effects are the same as those described in the first embodiment.

Fourth Embodiment

Figure 7:
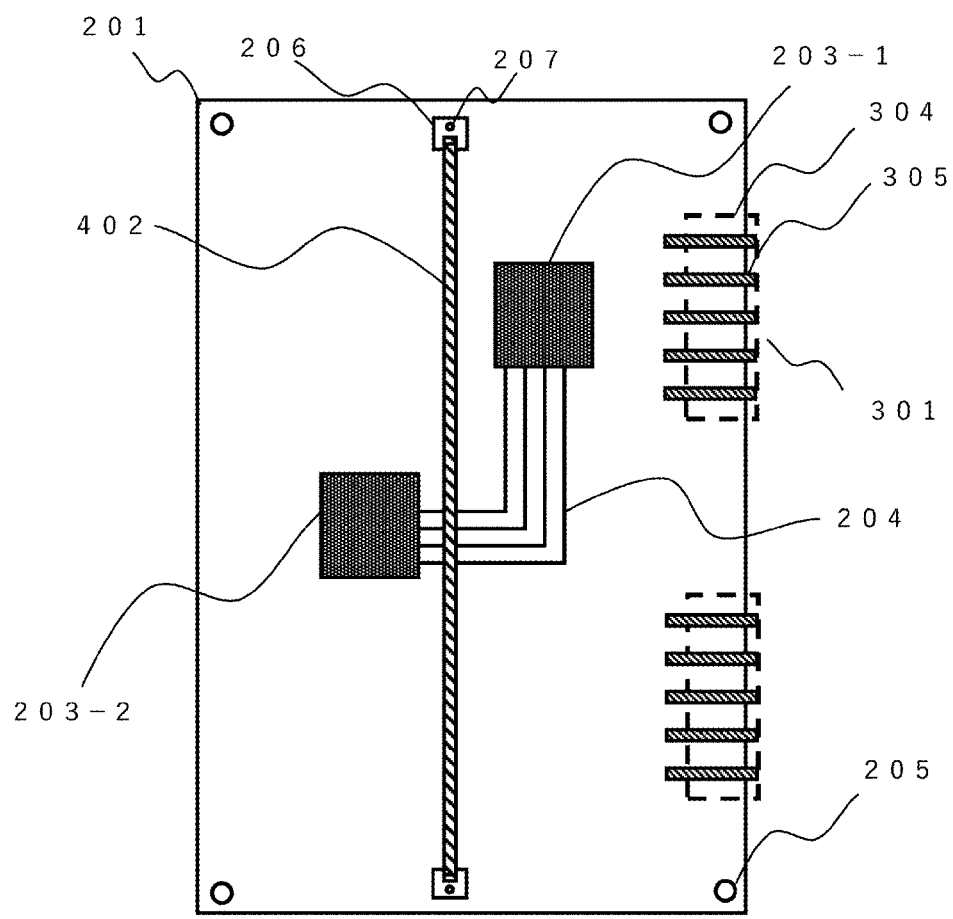
FIG. 7 is a top view of a circuit board of an electronic control device according to a fourth embodiment.

A fourth embodiment of the present invention will be described with reference to FIG. 7. FIG. 7 is a top view of the circuit board 201 in the electronic control device 100. The same portions as those of the first embodiment illustrated in FIG. 3 and the like are denoted by the same reference numerals, and the description thereof will be omitted.

In the present embodiment, the conductor component 402 is mounted substantially at the center of the circuit board 201 so as to be parallel with the side of the circuit board 201 where the connector 301 is mounted. Although one conductor component 402 is illustrated as an example, a plurality of conductor components 402 may be provided in parallel at substantially equal intervals. In a case where a large number of connectors are mounted due to an increase in the number of sensors and the like connected to the electronic control device 100, the circuit board 201 is often configured such that the side where the connector 301 is mounted is long. In this case, the resonance caused by the size in the longitudinal direction is generated from the lowest frequency, which is likely to cause a problem. However, in the present embodiment, the conductor component 402 is arranged in parallel in this direction, so that the problem due to the resonance can be made less likely to occur.

The material, shape, and the like of the conductor component 402 are similar to those described in the first embodiment. Other effects are the same as those described in the first embodiment.

Fifth Embodiment

Figure 8:
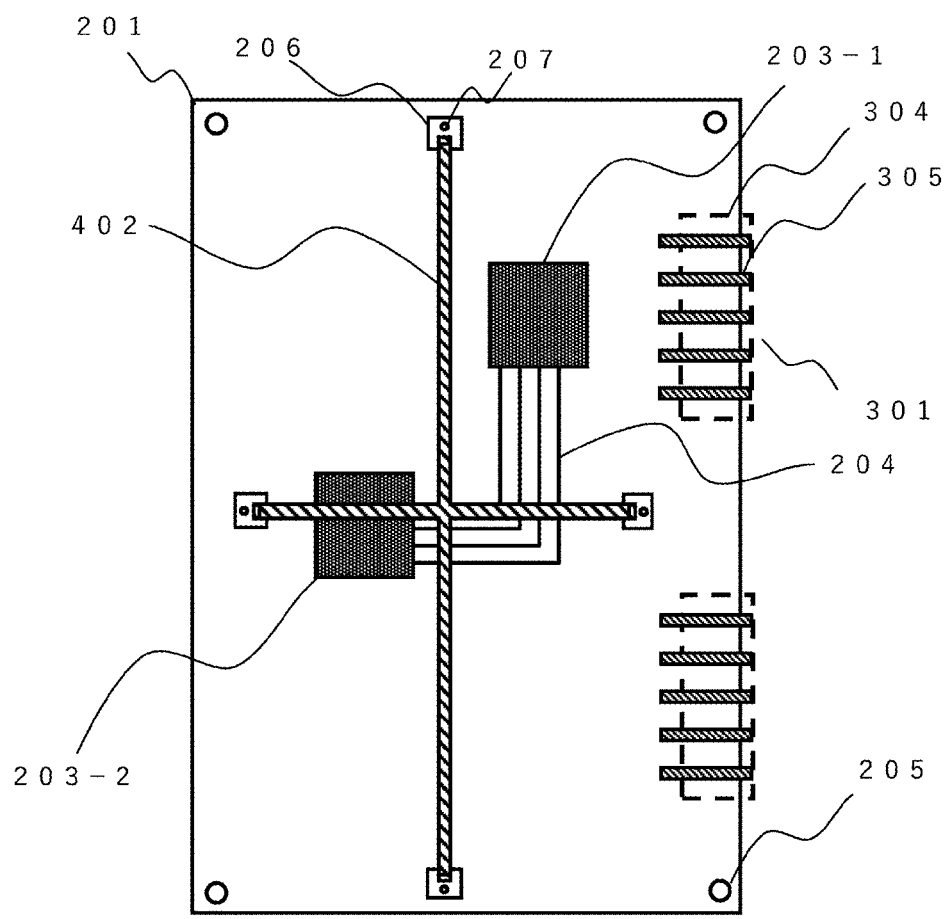
FIG. 8 is a top view of a circuit board of an electronic control device according to a fifth embodiment.

A fifth embodiment of the present invention will be described with reference to FIG. 8. FIG. 8 is a top view of the circuit board 201 in the electronic control device 100. The same portions as those of the first embodiment illustrated in FIG. 3 and the like are denoted by the same reference numerals, and the description thereof will be omitted.

In the present embodiment, the conductor components 402 have a cross shape. The longitudinal direction of each of the conductor components 402 forming the cross shape is arranged substantially at the center of the circuit board 201 so as to be parallel with the side of the circuit board 201. Note that the two conductor components 402 may form a cross shape by being combined to be parallel with the sides of the circuit board 201. Further, a plurality of conductor components 402 arranged in parallel with each side of the circuit board 201 may be combined vertically and horizontally. In a case where the plurality of conductor components 402 are arranged in parallel, the intervals between the conductor components are arranged at substantially the same interval. The connection between both ends of the conductor component 402 and the circuit board is similar to that described in the first embodiment or the third embodiment.

According to the present embodiment, it is possible to effectively suppress the influence of noise with respect to noise intruding from each side of the circuit board 201, that is, from the connector 301 side and noise due to the resonance in a direction parallel to the side where the connector 301 is mounted.

The material and the like of the conductor component 402 are similar to those described in the first embodiment. Other effects are the same as those described in the first embodiment.

Sixth Embodiment

Figure 9:
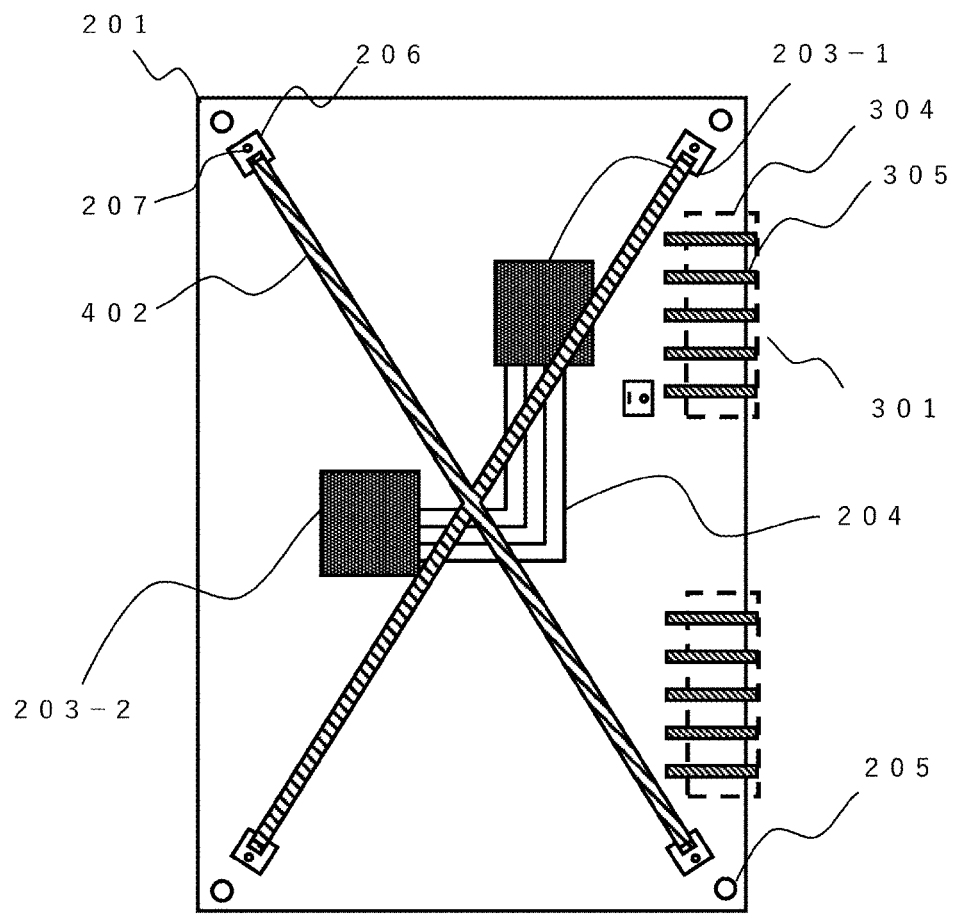
FIG. 9 is a top view of a circuit board of an electronic control device according to a sixth embodiment.

A sixth embodiment of the present invention will be described with reference to FIG. 9. FIG. 9 is a top view of the circuit board 201 in the electronic control device 100. The same portions as those of the first embodiment illustrated in FIG. 3 and the like are denoted by the same reference numerals, and the description thereof will be omitted.

In the present embodiment, the conductor components 402 have an X shape. The longitudinal direction of each of the conductor components 402 forming the X shape is arranged substantially at the center of the circuit board 201 so as to be on a diagonal line of the circuit board 201. Note that the two conductor components 402 may form the X shape by being combined to be on the diagonal lines of the circuit board 201. The connection between both ends of the conductor component 402 and the circuit board is similar to that described in the first embodiment or the third embodiment.

By disposing the conductor components 402 obliquely, it is possible to cover both of a plurality of resonances including vertical and horizontal resonances of the circuit board 201. In addition, since the circuit components and the like are often not arranged at the four corners of the circuit board 201 as compared with the vicinity of the center, there is an advantage that it is easy to arrange the lands 206 connected to the conductor components 402 at these portions.

The material and the like of the conductor component 402 are similar to those described in the first embodiment. Other effects are the same as those described in the first embodiment.

Seventh Embodiment

Figure 10:
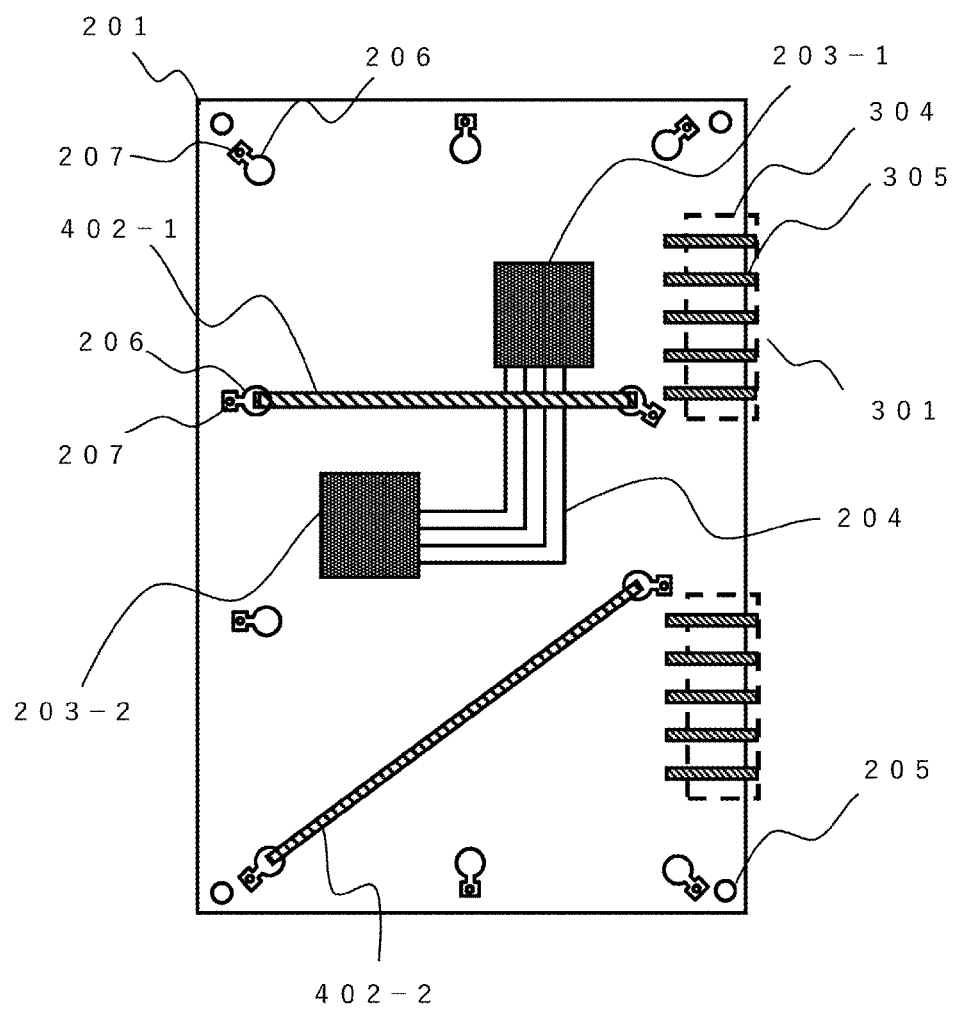
FIG. 10 is a top view of a circuit board of an electronic control device according to a seventh embodiment.

A seventh embodiment of the present invention will be described with reference to FIG. 10. FIG. 10 is a top view of the circuit board 201 in the electronic control device 100. The same portions as those of the first embodiment illustrated in FIG. 3 and the like are denoted by the same reference numerals, and the description thereof will be omitted.

In the present embodiment, the land 206 for installing the conductor components 402 has a circular shape, and the land 206 is provided at a plurality of locations on the circuit board 201. Since the land 206 has a circular shape, after the circuit board 201 is designed, the arrangement of the conductor component 402 can be appropriately selected by selecting two arbitrary lands 206 on the circuit board 201. In the example illustrated in FIG. 10, the conductor component 402-1 is disposed so as to connect one side of the circuit board 201 where the connector 301 is arranged and the other side of the circuit board 201 where the connector 301 is not arranged. The conductor component 402-2 is disposed obliquely from the corner of the circuit board 201 so as to straddle the opening portion of the connector 301.

The land 206 may have a shape corresponding to a plurality of arrangement directions of the conductor component 402, such as a fan shape and a polygonal shape, in addition to the circular shape.

The behavior of noise in the GHz band where resonance is likely to occur due to the size of the casing 103 may be difficult to predict at the time of design. In addition, the noise resistance of the integrated circuit 203 is also not known in advance at the time of design in many cases. In such a case, by changing the noise resistance by appropriately changing the way of attaching the conductor component 402 after design, it is possible to cope with the case without correcting the circuit pattern of the circuit board 201.

The material and the like of the conductor component 402 are similar to those described in the first embodiment. Other effects are the same as those described in the first embodiment.

Eighth Embodiment

Figure 11:
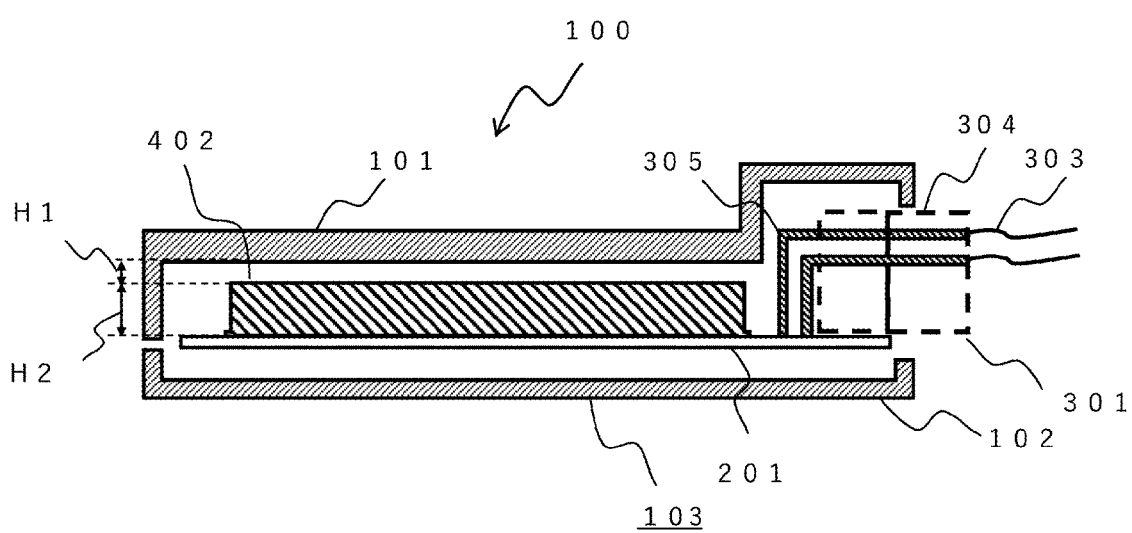
FIG. 11 is a sectional view of an electronic control device according to an eighth embodiment.
Figure 12:
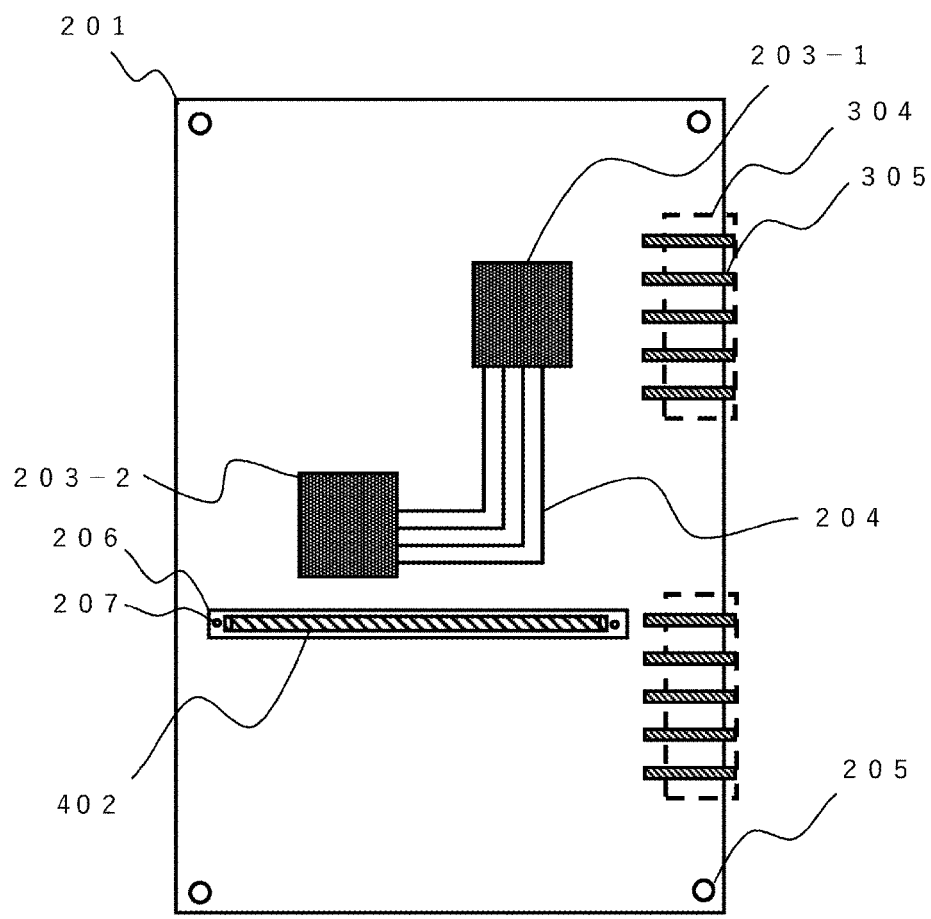
FIG. 12 is a top view of a circuit board of the electronic control device according to the eighth embodiment.

An eighth embodiment of the present invention will be described with reference to FIGS. 11 and 12. FIG. 11 is a sectional view of the electronic control device 100. FIG. 12 is a top view of the circuit board 201 in the electronic control device 100. The same portions as those of the first embodiment illustrated in FIGS. 2 to 4 and the like are denoted by the same reference numerals, and the description thereof will be omitted.

In the present embodiment, as illustrated in FIG. 11, the conductor component 402 has a partition wall shape standing on the circuit board 201, and is disposed on the circuit board 201. As illustrated in FIG. 12, the entire lower surface of the conductor component 402 is connected to the land 206 of the circuit board 201. The conductor component 402 is disposed so as to connect one side of the circuit board 201 where the connector 301 is arranged and the other side of the circuit board 201 where the connector 301 is not arranged. In the example illustrated in FIG. 12, the conductor component 402 separates an area where the integrated circuit 203-1 and the integrated circuit 203-2 are disposed from the other areas on the circuit board 201. As illustrated in FIG. 11, the distance H1 between the upper surface of the conductor component 402 and the casing upper portion 101 is arranged to be shorter than the distance H2 between the upper surface of the conductor component 402 and the upper surface of the circuit board 201.

The conductor component 402 is formed of a conductive material such as copper. In addition, the conductor component 402 may have a partition wall shape, and for example, may separate areas such as a flat plate shape.

According to the present embodiment, an area in which the radio-frequency integrated circuit 203 is mounted and other areas can be separated by the conductor component 402, and an area protected from electromagnetic noise in the casing 103 can be provided. Other effects are the same as those described in the first embodiment.

Ninth Embodiment

Figure 13:
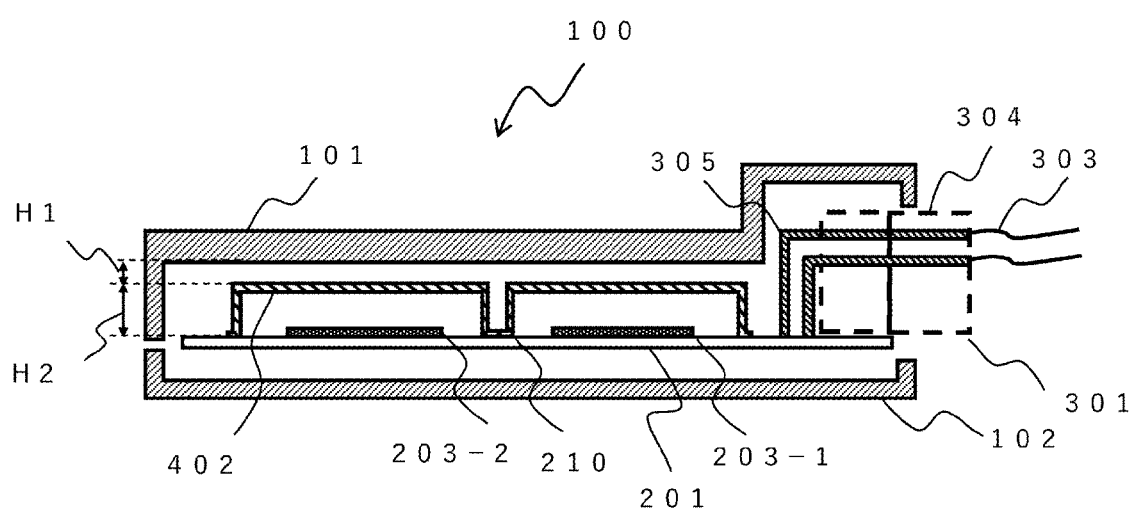
FIG. 13 is a sectional view of an electronic control device according to a ninth embodiment.

A ninth embodiment of the present invention will be described with reference to FIG. 13. FIG. 13 is a sectional view of the electronic control device 100. The same portions as those of the first embodiment illustrated in FIG. 2 and the like are denoted by the same reference numerals, and the description thereof will be omitted.

As illustrated in FIG. 13, both ends of the conductor component 402 are connected to the circuit board 201, and a substantially central portion of the conductor component 402 is also connected to the circuit board 201 at a connection point 210. The connection with the circuit board 201 is the same as that in the first embodiment, and is connected to the ground or the like on the circuit board 201. FIG. 13 illustrates an example in which one location of the substantially central portion of the conductor component 402 is connected to the circuit board 201. However, for example, in a case where the four sides of the circuit board 201 are long, a plurality of locations obtained by substantially equally dividing the conductor component 402 may be connected to the circuit board 201. That is, the conductor component 402 is also connected to the circuit board 201 at an intermediate point in addition to both the ends of the conductor component 402.

According to the present embodiment, since the conductor component 402 is fixed to the circuit board 201 at a plurality of locations, resistance to vibration and acceleration can be enhanced.

The material, shape, and the like of the conductor component 402 are similar to those described in the first embodiment. Other effects are the same as those described in the first embodiment.

Tenth Embodiment

Figure 14:
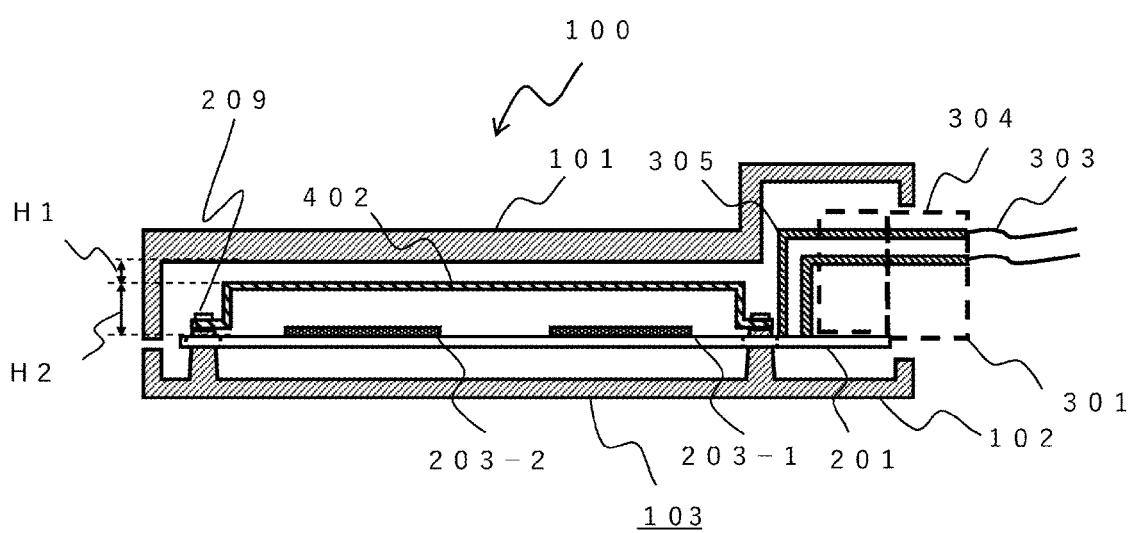
FIG. 14 is a sectional view of an electronic control device according to a tenth embodiment.

A tenth embodiment of the present invention will be described with reference to FIG. 14. FIG. 14 is a sectional view of the electronic control device 100. The same portions as those of the first embodiment illustrated in FIG. 2 and the like are denoted by the same reference numerals, and the description thereof will be omitted.

As illustrated in FIG. 14, a screw fixing hole is provided at a portion of the circuit board 201, and the conductor component 402 is directly fixed to the casing lower portion 102 using a screw 209 via the circuit board 201. Note that, FIG. 14 illustrates an example in which the casing lower portion 102 is directly fixed using the screw 209, but a protrusion may be provided in the casing lower portion 102, and the circuit board 201 and the conductor component 402 may be inserted and fixed to the protrusion. That is, the conductor component 402 is directly fixed to the casing 103 via the circuit board 201.

According to the present embodiment, by fixing the conductor component 402 to the casing 103 by screwing or the like, the fixing can be made more firm.

The material and the like of the conductor component 402 are similar to those described in the first embodiment. Other effects are the same as those described in the first embodiment.

Eleventh Embodiment

Figure 15:
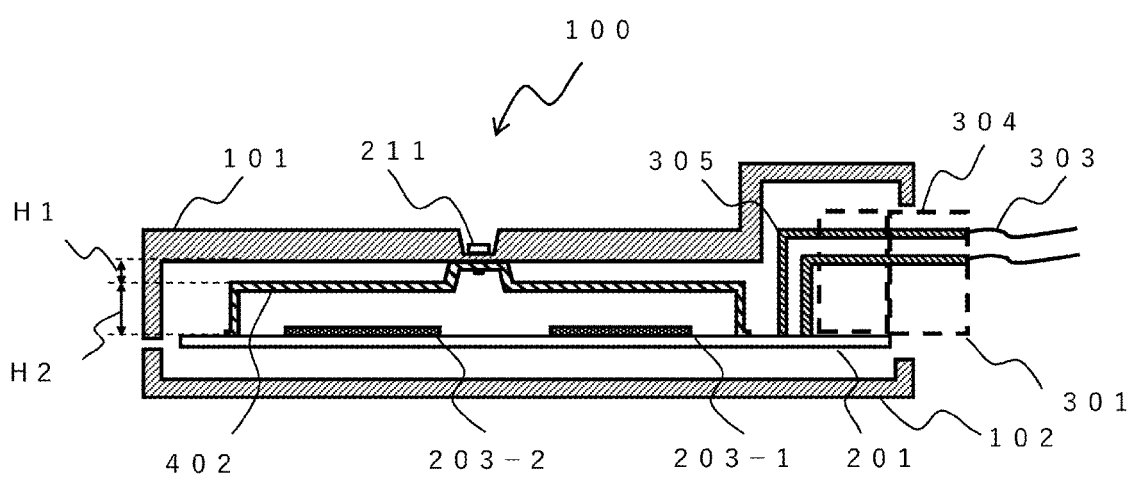
FIG. 15 is a sectional view of an electronic control device according to an eleventh embodiment.

An eleventh embodiment of the present invention will be described with reference to FIG. 15. FIG. 15 is a sectional view of the electronic control device 100. The same portions as those of the first embodiment illustrated in FIG. 2 and the like are denoted by the same reference numerals, and the description thereof will be omitted.

As illustrated in FIG. 15, both ends of the conductor component 402 are connected to the circuit board 201, and a substantially central portion of the conductor component 402 is fixed to the casing upper portion 101 using a screw 211. FIG. 15 illustrates an example in which one location of the substantially central portion of the conductor component 402 is connected to the casing upper portion 101. However, for example, in a case where the four sides of the circuit board 201 are long, a plurality of locations obtained by substantially equally dividing the conductor component 402 may be connected to the casing upper portion 101. That is, the conductor component 402 is in contact with the casing 103 at an intermediate point of the conductor component 402.

In the present embodiment, the conductor component 402 is fixed to the casing upper portion 101 at one or a plurality of locations using screws in the middle thereof, and conduction is established. As a result, a direct path is generated between the casing upper portion 101 and the conductor component 402, so that an effect of concentrating the noise path can be obtained. In addition, by fixing the middle of the conductor component 402, resistance to vibration and acceleration is improved.

The material and the like of the conductor component 402 are similar to those described in the first embodiment. Other effects are the same as those described in the first embodiment.

Twelfth Embodiment

Figure 16:
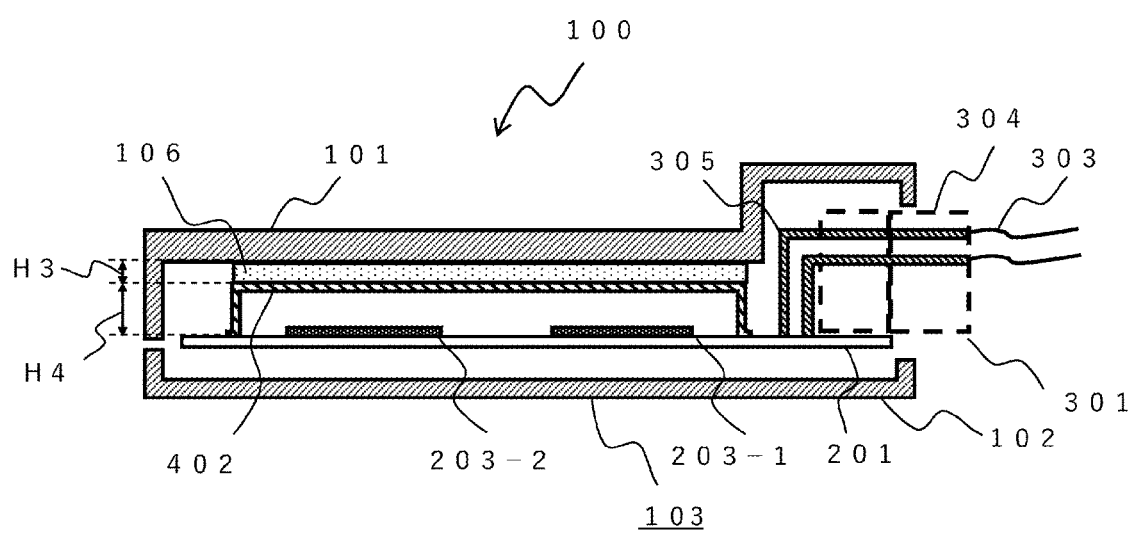
FIG. 16 is a sectional view of an electronic control device according to a twelfth embodiment.

A twelfth embodiment of the present invention will be described with reference to FIG. 16. FIG. 16 is a sectional view of the electronic control device 100. The same portions as those of the first embodiment illustrated in FIG. 2 and the like are denoted by the same reference numerals, and the description thereof will be omitted.

In the present embodiment, a dielectric 106 is inserted between the conductor component 402 and the casing upper portion 101. By inserting the dielectric 106, an effect of concentrating the noise electric field more strongly can be obtained, and thus, the position restriction with respect to a distance H3 between the conductor component 402 and the casing upper portion 101 is relaxed. Specifically, when the relative permittivity of the dielectric 106 is εr, 1/εr of the distance H3 between the conductor component 402 and the casing upper portion 101 is shorter than a distance H4 between the conductor component 402 and the circuit board 201. In other words, the distance H3 from the conductor component 402 to the casing upper portion 101 is shorter than a multiplication value of the distance H4 from the conductor component 402 to the circuit board 201 and the relative permittivity εr of the dielectric.

In the first embodiment to eleventh embodiment, the dielectric 106 may be inserted between the conductor component 402 and the casing upper portion 101.

Other effects of the present embodiment are the same as those described in the first embodiment.

According to the embodiments described above, the following operational effects can be obtained.

(1) The electronic control device 100 includes: the conductive casing 103; the circuit board 201 which is provided in the casing 103, and on which the electronic component including the integrated circuit 203 is mounted; and the conductive conductor component 402 that is provided on the circuit board 201, is disposed at a position higher than the electronic component, and has an elongated shape, in which a distance between the conductor component 402 and the casing 103 is shorter than a distance between the conductor component 402 and the circuit board 201. As a result, heat dissipation of the electronic component is excellent, and an influence on the circuit board due to noise entering and exiting from a gap of the casing and unnecessary electromagnetic wave radiation can be suppressed at low cost.

(2) The electronic control device 100 includes: the conductive casing 103; the circuit board 201 which is provided in the casing 103, and on which the electronic component including the integrated circuit 203 is mounted; the conductive conductor component 402 that is provided on the circuit board 201, is disposed at a position higher than the electronic component, and has an elongated shape; and the dielectric 106 that is inserted between the conductor component 402 and the casing 103, in which a distance from the conductor component 402 to the casing 103 is shorter than a multiplication value of a distance from the conductor component 402 to the circuit board 201 and a relative permittivity of the dielectric 106. As a result, heat dissipation of the electronic component is excellent, and an influence on the circuit board due to noise entering and exiting from a gap of the casing and unnecessary electromagnetic wave radiation can be suppressed at low cost.

The present invention is not limited to the above embodiments, and other forms conceivable within the scope of the technical idea of the present invention are also included within the scope of the present invention as long as the features of the present invention are not impaired. In addition, the above-described embodiments and a plurality of modifications may be combined.

The disclosure of the following priority application is incorporated herein by reference.

Japanese Patent Application No. 2019-82014 (filed on Apr. 23, 2019)

REFERENCE SIGNS LIST 100 electronic control device
101 casing upper portion
102 casing lower portion
103 casing
106 dielectric
201 circuit board
203-1, 203-2 integrated circuit
204 signal wiring
205 screw fixing hole
206 land
207 via hole
208 resistor
209 screw
304 connector housing
305 connector pin
402 conductor component

The invention claimed is:

1. An electronic control device comprising:
a conductive casing including an upper portion and a lower portion forming a gap;
a circuit board which is provided in the casing, and on which an electronic component including an integrated circuit is mounted;
an external connection terminal that is provided on the circuit board and is formed through the gap; and
a conductive conductor component that is provided on the circuit board, is disposed at a position higher than the electronic component, and has an elongated shape, the conductive conductor component configured to suppress an electric field between the circuit board and the conductive conductor, the electric field generated due to electromagnetic wave noise passing through the gap, wherein a width of the conductive conductor component is smaller than a width of the integrated circuit,
wherein a distance between the conductor component and the casing is shorter than a distance between the conductor component and the circuit board.

2. The electronic control device according to claim 1, wherein the conductor component is electrically connected to a ground on the circuit board at both ends of the conductor component or the casing directly or via a capacitor or a resistance.

3. The electronic control device according to claim 2, wherein the conductor component is connected to the ground of the circuit board via a resistor.

4. The electronic control device according to claim 3, wherein the resistor has a resistance value corresponding to a characteristic impedance determined from sectional structures of the conductor component and the casing.

5. The electronic control device according to claim 1, wherein in the circuit board, the external connection terminal is mounted, and the conductor component is arranged near a portion where the external connection terminal is mounted.

6. The electronic control device according to claim 5, wherein the external connection terminal is mounted near one side of the circuit board, and the conductor component is arranged to connect one side of the circuit board where the external connection terminal is mounted to an opposite side of the circuit board.

7. The electronic control device according to claim 5, wherein the conductor component is further mounted on a surface of the circuit board, the surface being opposite to a surface of the circuit board where the external connection terminal is mounted.

8. The electronic control device according to claim 1, wherein in the circuit board, an external connection terminal is mounted near one side of the circuit board, and the conductor component is arranged in parallel with the one side where the external connection terminal is mounted.

9. The electronic control device according to claim 1, wherein a plurality of the conductor components are arranged on the circuit board.

10. The electronic control device according to claim 9, wherein the conductor component is arranged in substantially parallel with four sides of the circuit board.

11. The electronic control device according to claim 9, wherein the conductor component is arranged on a diagonal line of the circuit board.

12. The electronic control device according to claim 1, wherein the circuit board has a plurality of lands for connecting the conductor component, on the circuit board in advance, and the land has a shape corresponding to a plurality of arrangement directions of the conductor component.

13. The electronic control device according to claim 1, wherein the conductor component has a partition wall shape standing on the circuit board, and a lower surface of the conductor component is connected to the circuit board.

14. The electronic control device according to claim 1, wherein the conductor component is also connected to the circuit board at an intermediate point in addition to both ends of the conductor component.

15. The electronic control device according to claim 1, wherein the conductor component is directly fixed to the casing via the circuit board.

16. The electronic control device according to claim 1, wherein the conductor component is in contact with the casing at an intermediate point of the conductor component.

17. An electronic control device comprising:
a conductive casing including an upper portion and a lower portion forming a gap;
a circuit board which is provided in the casing, and on which an electronic component including an integrated circuit is mounted;
an external connection terminal that is provided on the circuit board and is formed through the gap;
a conductive conductor component that is provided on the circuit board, is disposed at a position higher than the electronic component, and has an elongated shape, the conductive conductor component configured to suppress an electric field between the circuit board and the conductive conductor, the electric field generated due to electromagnetic wave noise passing through the gap, wherein a width of the conductive conductor component is smaller than a width of the integrated circuit; and
a dielectric that is inserted between the conductor component and the casing,
wherein a distance from the conductor component to the casing is shorter than a multiplication value of a distance from the conductor component to the circuit board and a relative permittivity of the dielectric.

* * * * *